(12) United States Patent
Liang

(10) Patent No.: US 7,203,076 B1
(45) Date of Patent: Apr. 10, 2007

(54) RETENTION DEVICE USED IN A CIRCUIT CARD OF A COMPUTER

(75) Inventor: Chien-Fa Liang, Chung-Ho (TW)

(73) Assignee: Super Micro Computer, San Jose, CA (US)

( * ) Notice: Subject to any disclaimer, the term of this patent is extended or adjusted under 35 U.S.C. 154(b) by 0 days.

(21) Appl. No.: 11/477,612

(22) Filed: Jun. 30, 2006

(51) Int. Cl.
*H05K 7/14* (2006.01)
*H05K 7/18* (2006.01)

(52) U.S. Cl. ............... 361/801; 361/756; 361/802; 361/755

(58) Field of Classification Search ........ 361/790, 361/797, 800–802, 756, 741, 754–755
See application file for complete search history.

(56) References Cited

U.S. PATENT DOCUMENTS 6,069,796 A * 5/2000 Hastings et al. ........... 361/754
6,215,673 B1 * 4/2001 Gordon et al. ............ 361/801
7,035,117 B2 * 4/2006 Chen et al. ............... 361/801
7,050,296 B2 * 5/2006 Liao ......................... 361/685

* cited by examiner

*Primary Examiner*—Tuan Dinh
*Assistant Examiner*—Hung S. Bui
(74) *Attorney, Agent, or Firm*—Troxell Law Office, PLLC

(57) ABSTRACT

A retention device used in a circuit card of a computer is composed of a fixing board, an upper board surface of which is provided with a positioning hole having two ear parts at two sides; a positioning member, two sides of which are provided with shaft members which can be transfixed into shaft holes of the ear parts, and pressing surfaces at a lower part of which are pressed and in touch with a horizontal board surface of the fixing board. A projection piece which is extended from a metallic piece connected at a side of a circuit card is pressed by the positioning member which is rotated in the shaft holes with the shaft parts, to release the circuit card from being positioned and pressed, such that the circuit card can be easily taken out of the fixing board, thereby achieving a robustness in positioning the circuit card, along with a quick and convenient dismantling and assembling.

4 Claims, 7 Drawing Sheets

RETENTION DEVICE USED IN A CIRCUIT CARD OF A COMPUTER

BACKGROUND OF THE INVENTION (a) Field of the Invention

The present invention relates to a retention device used in a circuit card of a computer, and more particularly to a locking and positioning device whereby a circuit card can be quickly locked and positioned in a computer casing, as well as extracted out of the casing.

(b) Description of the Prior Art

It is known that all of conventional circuit boards are fixed inside computers by screwing, which is very troublesome and inconvenient in dismantling and assembling. On the other hand, another kind of circuit board, such as an interface card or a circuit card, is fixed inside a computer casing by only screwing a metallic board at a side, which is provided with a drawback that the interface card or circuit card is not stably positioned.

SUMMARY OF THE INVENTION

The primary object of present invention is to provide a retention device used in a circuit card of a computer, which is able to enhance a robustness in positioning the circuit card.

Another object of the present invention is to provide a retention device used in a circuit card of a computer, so as to enable a quick and convenient dismantling and assembling of the circuit card.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
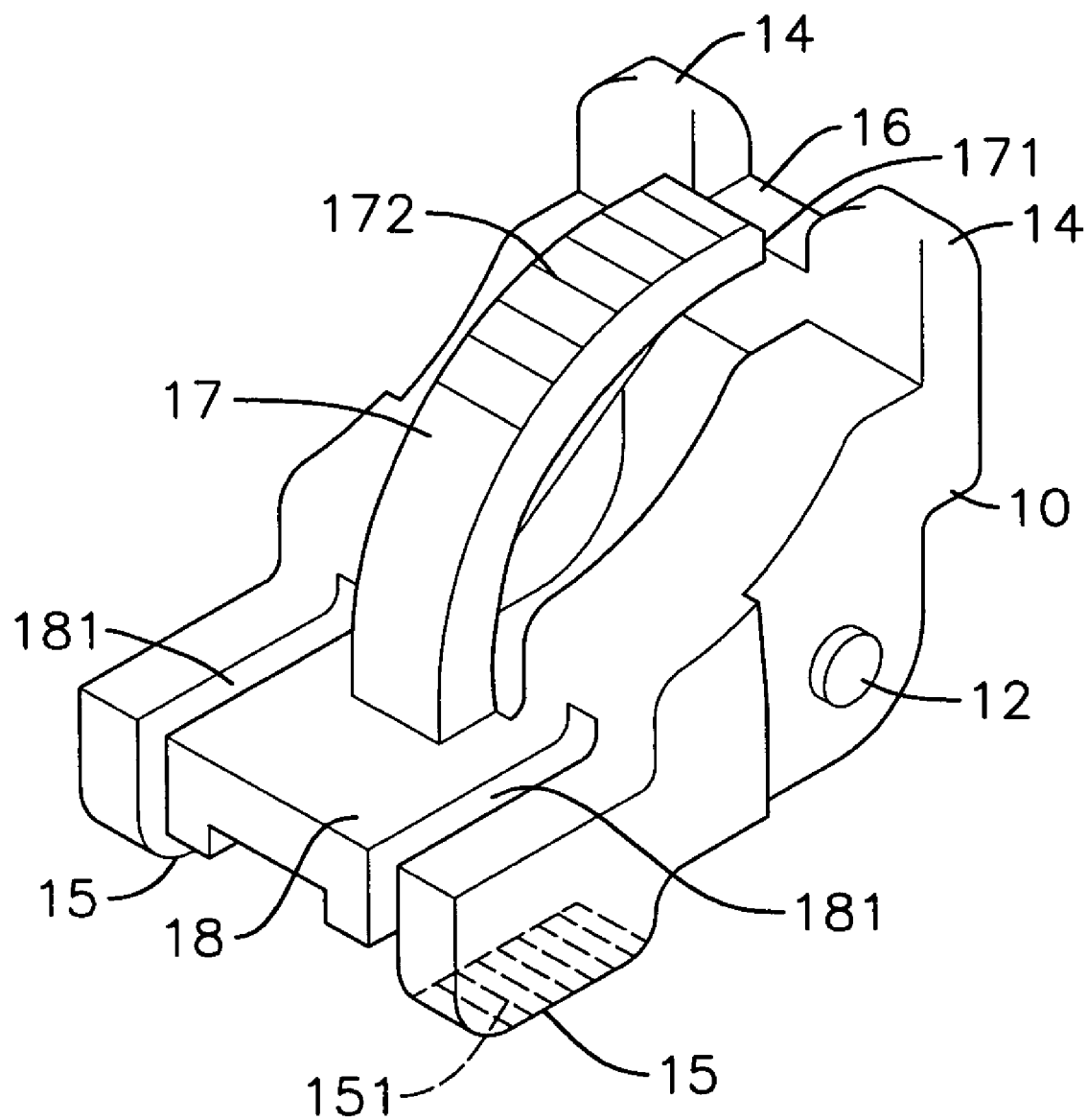
FIG. 1 shows a perspective view of a positioning member of the present invention.
Figure 2:
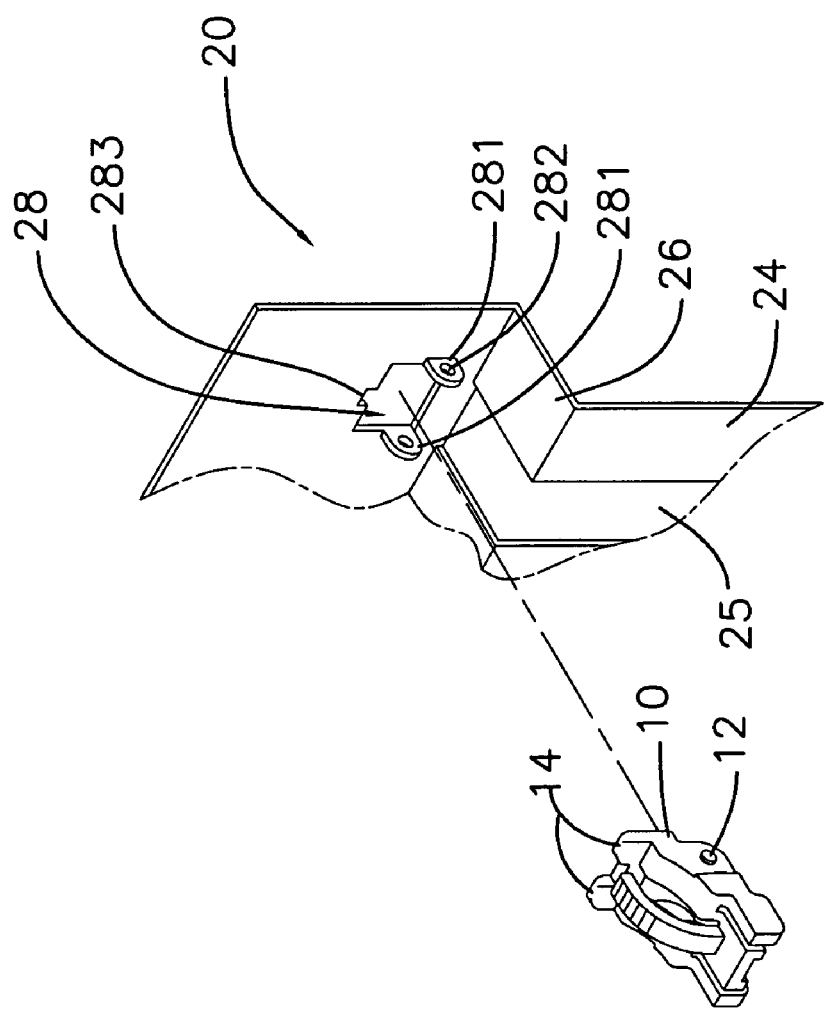
FIG. 2 shows a local exploded view of a positioning member of the present invention, which is locked on a fixing board.

Referring to FIG. 1 and FIG. 2, the present invention is to provide a retention device used in a circuit board of a computer, which includes a positioning member 10, two sides of which are provided with shaft members 12 respectively, an upper rear part of which is formed with projection bodies 14 and an upper indent part 16 for lifting, lower sides of which are provided with pressing surfaces 15, and a bottom surface 18 of which is provided with a flexible arc-shape strip 17 which is extending upward and is provided with a suspended end part 171 corresponding to the upper indent part 16; and a fixing board 20 which is formed by an upper board surface 22, a lower board surface 24, and a horizontal board surface 26. At least more than one through-slot 25 is located in the lower board surface 24 and the horizontal board surface 26, respectively. At least more than one positioning hole 28 is formed on the upper board surface 22, an inner edge of the positioning hole 28 is provided with two ear parts 281 which are installed with shaft holes 282, and an upper rim of the positioning hole 28 is formed with a notch 283.

Figure 4:
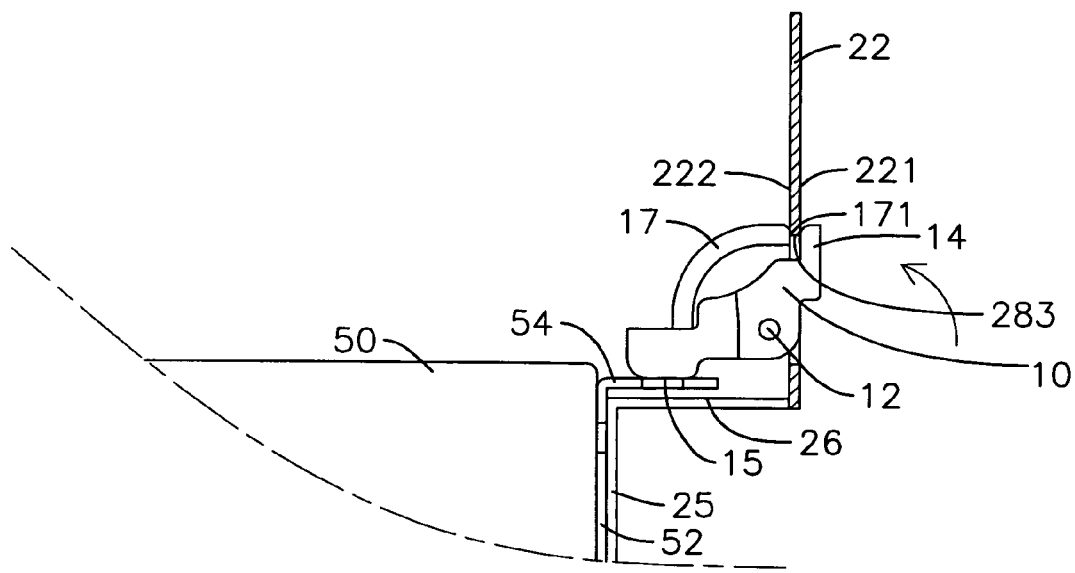
FIG. 4 shows a side view of an action in locking and positioning a circuit card by a positioning member of the present invention.

The positioning member 10 can be transfixed into the positioning hole 28, the shaft members 12 are loosely connected into the shaft holes 282, and the projection bodies 14 are located at exteriors of an outer wall 221 of the upper board surface 22 (as shown in FIG. 4).

Referring to FIGS. 3 to 6, an inner side of the fixing board 20 is provided with a bottom board surface 30 which is installed with a connection port 40.

Figure 6:
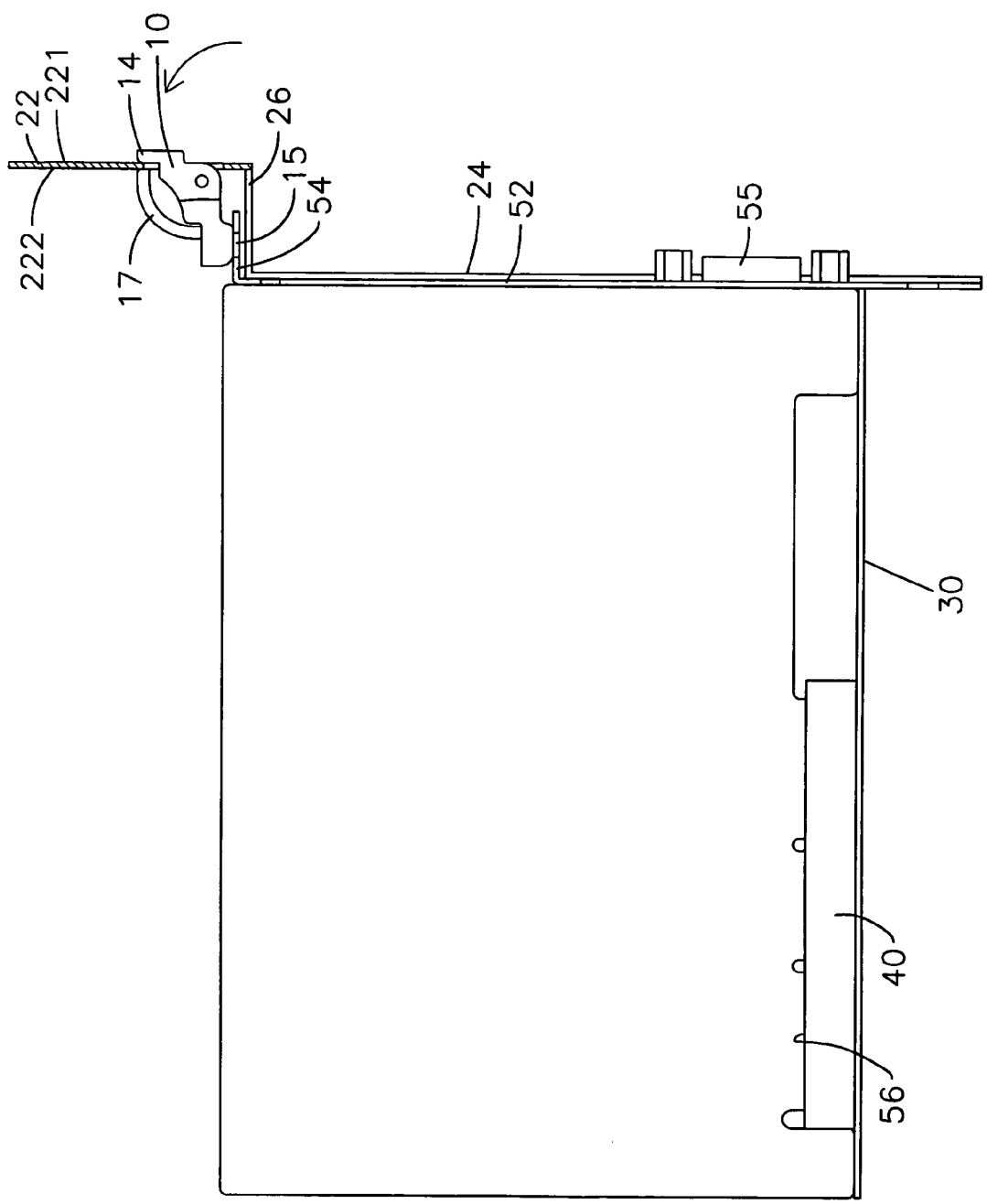
FIG. 6 shows a side view of a positioning member of the present invention, which locks and positions a circuit card.

An outer edge of a circuit card 50 is connected with a metallic piece 52, an upper rim of which is extended with a horizontal projection piece 54. The metallic piece 52 is abutted on the lower board surface 24, the horizontal projection piece 54 is corresponding to an upper part of the horizontal board surface 26, and the pressing surfaces 15 are pressed on the projection piece 54 (as shown in FIG. 6), to fix the metallic piece 52. A lower connection end 56 of the circuit card 50 is inserted into the connection port 40.

Referring to FIG. 4, the arc-shape strip 17 is an elastic member, and its end part 171 can be abutted on an inner surface 222 of the upper board surface 22.

Figure 3:
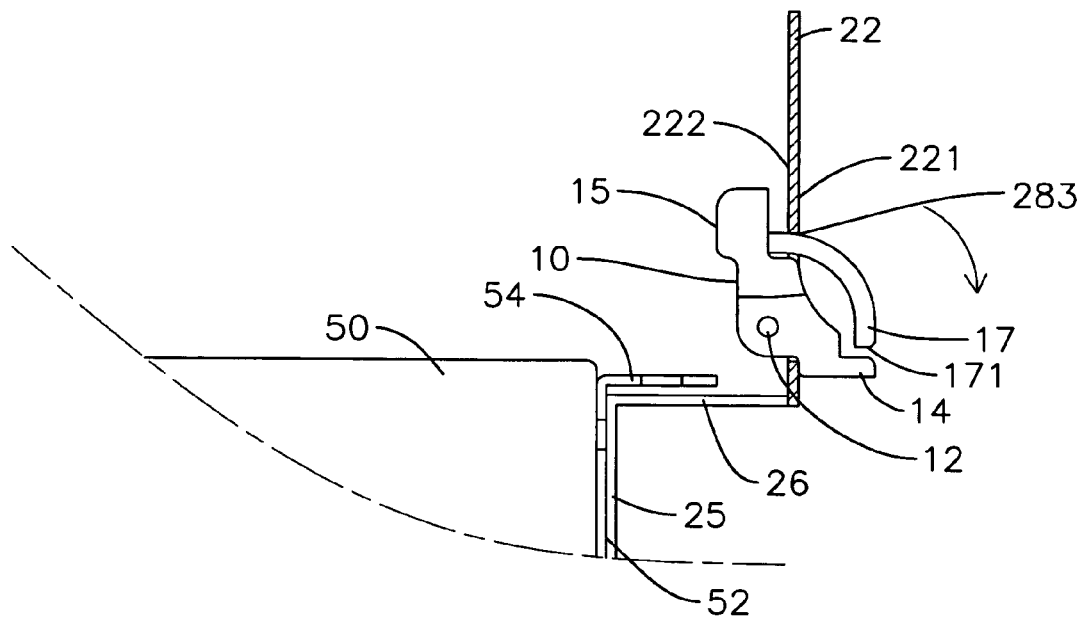
FIG. 3 shows a side view of an action in releasing a positioning member of the present invention from a circuit card.

Referring to FIG. 3, when the end part 171 is subjected to a force, it can be displaced flexibly and pass through the notch 283.

Referring to FIG. 1, the bottom surface 18 of positioning member 10 is provided with long narrow holes 181.

Figure 5:
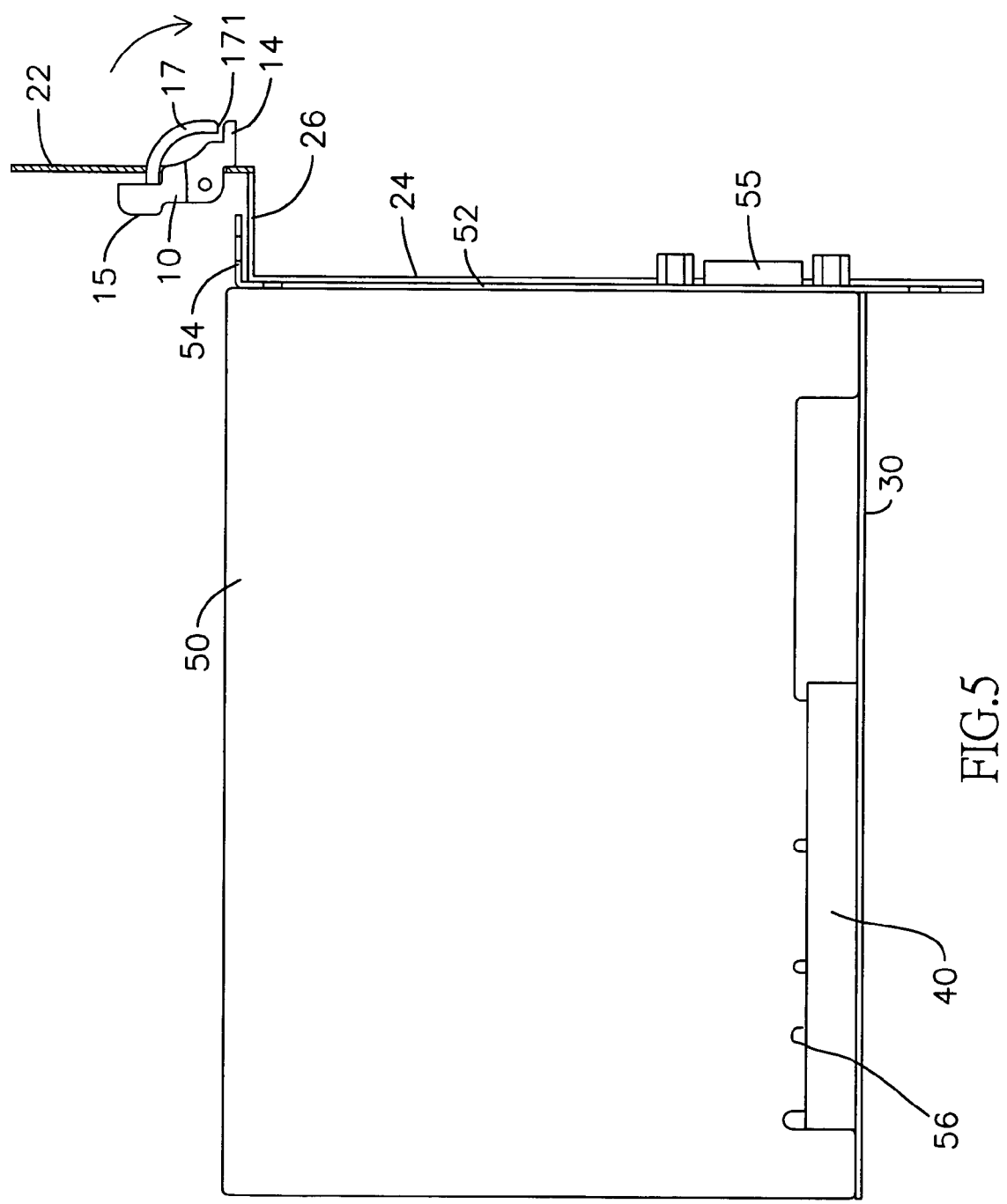
FIG. 5 shows a side view of a positioning member of the present invention, which is released from a circuit card.

Referring to FIG. 3 and FIG. 5, a lower connection end 56 of circuit card 50 is inserted into a connection port 40. At this time, a metallic piece 52 is abutted on a lower board surface 24, a terminal socket 55 connected to the metallic piece 52 is protruded out of a through-slot 25, a horizontal projection piece 54 is located above two neighboring horizontal board surfaces 26 (or is in touch with the horizontal board surfaces 26), and an arc-shape strip 17 is located in a notch 283. A positioning member 10 is defined as an open state at this time.

Referring to FIG. 4 and FIG. 6, an operator uses a finger to lift projection bodies 14 from a bottom to a top, such that the entire positioning member 10 can be rotated by a limited angle against shaft members 12, the shaft members 12 can be rotated in shaft holes 282, and an upper surface of the arc-shape strip 17 can be abutted on an edge of the notch 283 to be flexibly deformed. Along with a displacement of body of the positioning member 10, after an end part 171 passes through the notch 283, the entire arc-shape strip 17 is elastically restored, the end part 171 is pressed on an inner surface 222, and pressing surfaces 15 are pressed on the projection piece 54, so as to position and fix the metallic piece 52, thereby achieving an object of locking and positioning the circuit card 50. At this time, other two projection bodies 14 are in touch with and stopped at an outer wall 221, wherein an upper surface of the arc-shape strip 17 is provided with slid-proof projection lines 172 to increase an effect of locking and positioning at the notch 283.

Referring to FIG. 1, a design of two long narrow holes 181 is to enable a bottom surface 18 of the arc-shape strip 17 to be elastically displaced downward when the arc-shape strip 17 is subjected to a pressure to be deformed, which further allows the arc-shape strip 17 to have a better elastic force and flexibility.

Figure 7:
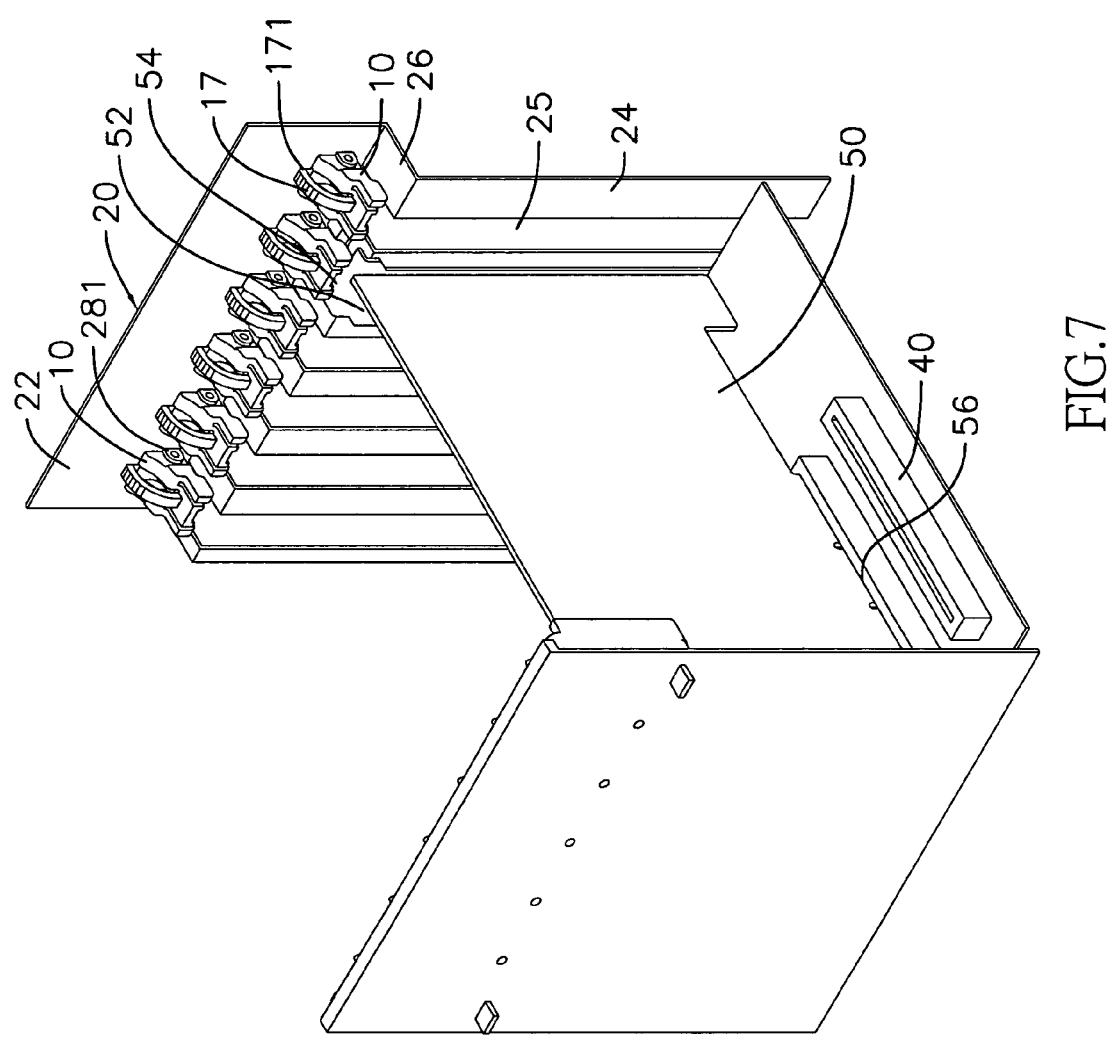
FIG. 7 shows a perspective view of a positioning member of the present invention, which presses and latches a metallic connection piece at a side of circuit card.

FIG. 7 shows a perspective status that the projection piece 54 of metallic piece 52 which is connected at a side of the circuit card 50 is pressed by the positioning member 50, and in the mean time, the lower connection end 56 of circuit card 50 is inserted into the connection port 40.

Figure 8:
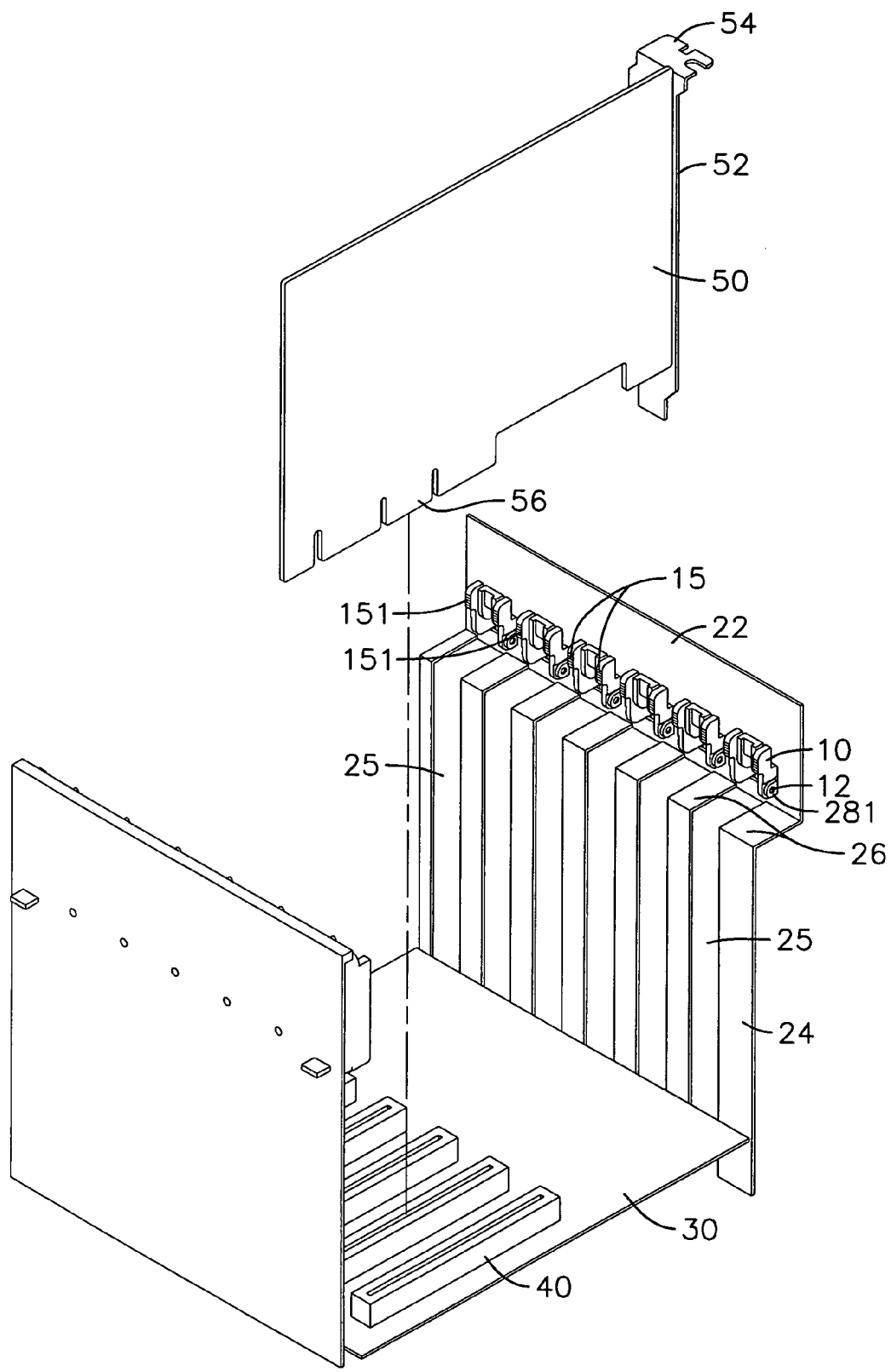
FIG. 8 shows a perspective view of a circuit card which is released from a positioning member of the present invention and is extracted out.

Referring to FIG. 8, the positioning member 10 is rotated to another position, or the open state, such that the pressing surfaces 15 will be released from the projection piece 54, enabling the circuit card 50 to be easily and quickly extracted out. The pressing surfaces 15 can be added with a plurality of projection lines 151, to enhance a locking effect of pressing the surface of projection piece 54.

Accordingly, the present invention is provided with a function of locking and fixing without using screws, and can be used to quickly and conveniently assemble and dismantle the circuit card 50 or a circuit board inside a computer casing.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A retention device used in a circuit card of a computer, comprising:
 a positioning member, two sides of which are provided with shaft members respectively, an upper rear part of which is formed with projection bodies and an upper indent part for lifting, and lower sides of which are formed with pressing surfaces; an flexible arc-shape strip being extended upward from a bottom surface, with a suspended end part corresponding to the upper indent part; a fixing board which is formed by an upper board surface, a lower board surface, and a horizontal board surface; at least more than one through-slot being installed in the lower board surface and the horizontal board surface, respectively; at least more than one positioning hole being formed on the upper board surface, an inner edge of the positioning hole being formed with two ear parts which are provided with shaft holes; an upper rim of the positioning hole being formed with a notch; the positioning member being able to be transfixed into the positioning hole, the shaft members being loosely connected into the shaft holes, and the projection bodies being located at exteriors of an outer wall of the upper board surface.

2. The retention device used in a circuit card of a computer according to claim 1, wherein an inner side of the fixing board is provided with a bottom surface on which is installed with a connection port; an outer edge of the circuit card being connected with a metallic piece, and an upper rim of which is extended with a horizontal projection piece; the metallic piece being abutted on the lower board surface, the horizontal projection piece being corresponding to an upper part of the horizontal board surface, and the pressing surfaces being pressed on the projection piece, so as to fix the metallic piece; a lower connection end of the circuit card being inserted into the connection port.

3. The retention device used in a circuit card of a computer according to claim 1, wherein the arc-shape strip is an elastic member, the end part of which being able to be abutted on an inner surface of the upper board surface, and being able to be displaced flexibly and passing through the notch, upon being subjected to a force.

4. The retention device used in a circuit card of a computer according to claim 1, wherein a bottom surface of the positioning member is provided with long narrow holes.

* * * * *